US011495645B2

(12) United States Patent
Kim et al.

(10) Patent No.: US 11,495,645 B2
(45) Date of Patent: Nov. 8, 2022

(54) DISPLAY APPARATUS AND METHOD OF MANUFACTURING THE SAME

(71) Applicant: Samsung Display Co., Ltd., Yongin-si (KR)

(72) Inventors: Jaeik Kim, Yongin-si (KR); Jaesik Kim, Yongin-si (KR); Yeonhwa Lee, Yongin-si (KR); Joongu Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 224 days.

(21) Appl. No.: 16/815,938

(22) Filed: Mar. 11, 2020

(65) Prior Publication Data

US 2020/0411614 A1 Dec. 31, 2020

(30) Foreign Application Priority Data

Jun. 26, 2019 (KR) .......................... 10-2019-0076342

(51) Int. Cl.
*H01L 27/32* (2006.01)
*H01L 51/52* (2006.01)
*H01L 51/56* (2006.01)

(52) U.S. Cl.
CPC ........ *H01L 27/3246* (2013.01); *H01L 27/326* (2013.01); *H01L 51/5253* (2013.01); *H01L 51/56* (2013.01); *H01L 2251/303* (2013.01)

(58) Field of Classification Search
CPC ............... H01L 27/3246; H01L 27/326; H01L 51/5253; H01L 51/56; H01L 2251/303
USPC ........................................................... 257/40
See application file for complete search history.

(56) References Cited

U.S. PATENT DOCUMENTS

| 8,871,545 | B2 | 10/2014 | Lee et al. | |
| 9,231,211 | B2 | 1/2016 | Lee et al. | |
| 9,570,471 | B2 | 2/2017 | Heo et al. | |
| 2016/0071914 | A1* | 3/2016 | Lee ..................... | H01L 51/5234 438/46 |

(Continued)

FOREIGN PATENT DOCUMENTS

| KR | 10-0337493 B1 | 5/2002 |
| KR | 10-2016-0016339 A | 2/2016 |

(Continued)

*Primary Examiner* — Dzung Tran
(74) *Attorney, Agent, or Firm* — Lewis Roca Rothgerber Christie LLP

(57) ABSTRACT

A display apparatus having improved reliability and preventing or reducing damage to an organic light-emitting diode (OLED), and a method of manufacturing the display apparatus by arranging a protective layer on an opposite electrode during a photo-patterning process, are provided. The display apparatus includes: a substrate; a pixel electrode on the substrate; a pixel defining layer on the pixel electrode, the pixel defining layer having a first opening that exposes a center of the pixel electrode; an auxiliary electrode on the pixel defining layer; an intermediate layer on the pixel electrode; an opposite electrode facing the pixel electrode with the intermediate layer therebetween; a first protective layer on the opposite electrode; and a contact electrode on the first protective layer, the contact electrode electrically contacting the auxiliary electrode and the opposite electrode.

12 Claims, 18 Drawing Sheets

(56) References Cited

U.S. PATENT DOCUMENTS

| | | | |
|---|---|---|---|
| 2016/0126304 A1* | 5/2016 | Cho | H01L 51/5228 |
| | | | 438/23 |
| 2018/0033968 A1 | 2/2018 | Lee et al. | |
| 2018/0138441 A1 | 5/2018 | Choung et al. | |
| 2018/0261792 A1* | 9/2018 | Kwon | H01L 51/5203 |
| 2018/0358584 A1* | 12/2018 | Jeong | H01L 51/56 |
| 2020/0119114 A1* | 4/2020 | Kim | H01L 27/3246 |
| 2020/0144529 A1* | 5/2020 | Lee | H01L 51/56 |

FOREIGN PATENT DOCUMENTS

| | | |
|---|---|---|
| KR | 10-2018-0014895 A | 2/2018 |
| KR | 10-2018-0055024 A | 5/2018 |

\* cited by examiner

DISPLAY APPARATUS AND METHOD OF MANUFACTURING THE SAME

CROSS-REFERENCE TO RELATED APPLICATION

This application claims priority to and the benefit of Korean Patent Application No. 10-2019-0076342, filed on Jun. 26, 2019, in the Korean Intellectual Property Office, the disclosure of which is incorporated herein in its entirety by reference.

BACKGROUND

1. Field

The disclosure relates to a display apparatus and a method of manufacturing the display apparatus, and more particularly, to a display apparatus having an improved reliability and a method of manufacturing the display apparatus.

2. Description of Related Art

Among display apparatuses, an organic light-emitting display apparatus has been highlighted as a next-generation display apparatus due to its wide viewing angle, high contrast, and/or fast response speed.

In an organic light-emitting display apparatus, each pixel includes an organic light-emitting diode (OLED). The OLED includes a pixel electrode, an opposite electrode facing the pixel electrode, and an emission layer between the pixel electrode and the opposite electrode.

In an organic light-emitting display apparatus that realizes full-color display, light of different colors is emitted from each pixel region, and an emission layer in each pixel and an opposite electrode that is provided integrally through a plurality of pixels may be obtained by using a deposition mask. As an organic light-emitting display apparatus ends up having high resolution, a width of an open slit in a mask that is used in a deposition process is gradually reduced, and further, there is demand to reduce a dispersion of open slits. Also, there is a need to reduce or prevent a shadow effect in order to manufacture a high-resolution organic light-emitting display apparatus. Accordingly, a deposition process may be performed in a state in which a substrate and a mask are close to each other.

SUMMARY

However, in a display apparatus according to the related art, when a deposition process is performed in a state in which a substrate and a mask are closely arranged with each other, the mask may damage an upper portion of a pixel electrode.

One or more aspects include a display apparatus capable of preventing or reducing damage to an organic light-emitting diode (OLED) and having improved reliability and a method of manufacturing the display apparatus. However, the above technical feature is exemplary and the scope of the disclosure is not limited thereto.

Additional aspects will be set forth in part in the description which follows and, in part, will be apparent from the description, or may be learned by practice of the presented embodiments of the disclosure.

According to an embodiment, a display apparatus includes: a substrate; a pixel electrode on the substrate; a pixel defining layer on the pixel electrode, the pixel defining layer having a first opening that exposes a center portion of the pixel electrode; an auxiliary electrode on the pixel defining layer; an intermediate layer on the pixel electrode; an opposite electrode facing the pixel electrode with the intermediate layer therebetween; a first protective layer on the opposite electrode; and a contact electrode on the first protective layer, the contact electrode being in electrical contact with the auxiliary electrode and the opposite electrode.

The auxiliary electrode may have a second opening that exposes at least partially an upper surface of the pixel defining layer, the second opening being larger than the first opening.

An end of the auxiliary electrode and an end of the intermediate layer may be spaced apart from each other on the pixel defining layer.

The first protective layer on the opposite electrode may at least partially expose opposite end portions of the opposite electrode.

The first protective layer may include an inorganic material having an optical bandgap of 3 eV or greater.

The first protective layer may include metal oxide having a dielectric constant of 10 or greater.

The first protective layer may include a light-transmitting organic material.

The first protective layer may have a thickness of 1 nm to 100 nm.

The contact electrode may include a light-transmitting conductive material.

The contact electrode may directly and electrically contact the opposite electrode, at opposite end portions of the opposite electrode that are at least partially exposed by the first protective layer.

The contact electrode may directly and electrically contact the auxiliary electrode.

The display apparatus may further include a second protective layer on the contact electrode.

According to an embodiment, a method of manufacturing a display apparatus includes: preparing a substrate; forming a pixel electrode on the substrate; forming a pixel defining layer on the pixel electrode, the pixel defining layer having a first opening that exposes a center portion of the pixel electrode; forming an auxiliary electrode on the pixel defining layer, the auxiliary electrode having a second opening that is larger than the first opening; forming a lift-off layer on the auxiliary electrode and a mask layer on the lift-off layer, the lift-off layer having a third opening, and the mask layer having a fourth opening that is smaller than the third opening; forming an intermediate layer on the pixel electrode through the fourth opening; forming an opposite electrode on the intermediate layer through the fourth opening; forming a first protective layer on the opposite electrode through the fourth opening; forming a contact electrode on the first protective layer through the fourth opening, the contact electrode electrically contacting the auxiliary electrode and the opposite electrode; forming a second protective layer on the contact electrode through the fourth opening; and removing the lift-off layer and the mask layer.

In the forming of the intermediate layer, an end of the intermediate layer and an end of the auxiliary electrode may be spaced apart from each other on the pixel defining layer.

In the forming of the first protective layer, the first protective layer may be arranged on the opposite electrode while at least partially exposing opposite end portions of the opposite electrode.

The first protective layer may have a thickness of 1 nm to 100 nm.

The contact electrode may include a light-transmitting conductive material.

The contact electrode may directly and electrically contact the opposite electrode, at the opposite end portions of the opposite electrode that are at least partially exposed by the first protective layer.

The contact electrode may directly and electrically contact the auxiliary electrode.

A material of the opposite electrode may be introduced at a first incident angle, a material of the contact electrode may be introduced at a second incident angle, and the second incident angle may be greater than the first incident angle.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
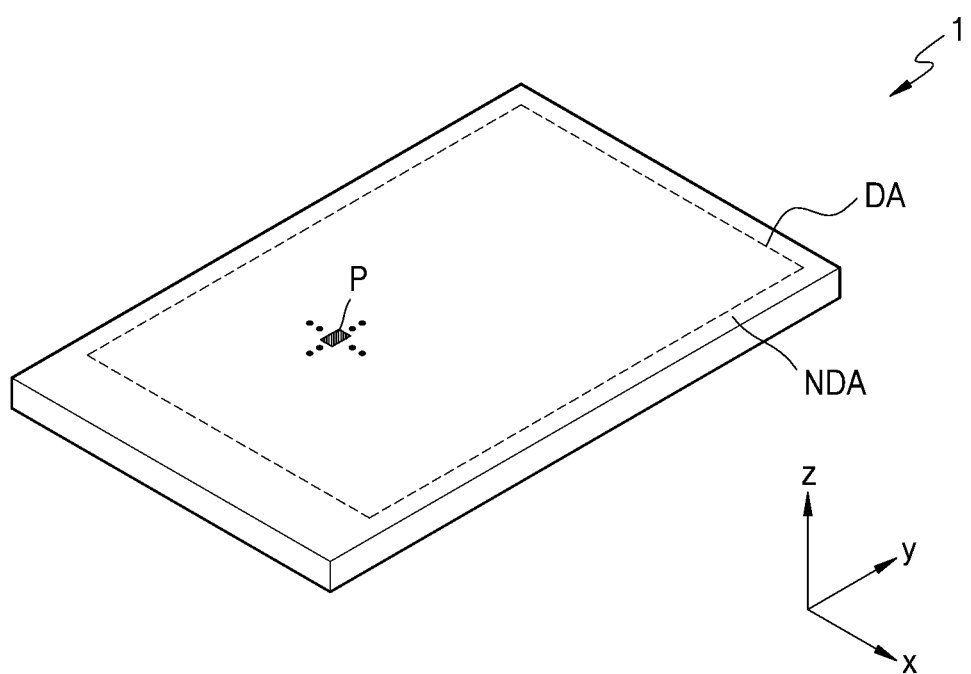
FIG. 1 is a perspective view of a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The example embodiments will be described below in more detail with reference to the accompanying drawings. Those components that are the same or are in correspondence are denoted by the same or like reference numeral regardless of the figure number, and redundant explanations are not provided again.

While terms such as "first," "second," etc., may be used to describe various components, such components are not to be limited to the above terms. The above terms are used only to distinguish one component from another. An expression used in the singular encompasses the expression of the plural, unless it has a clearly different meaning in the context.

It will be further understood that the terms "comprises" and/or "comprising" as used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a perspective view of a display apparatus 1 according to an embodiment.

Referring to FIG. 1, the display apparatus 1 includes a display area DA and a non-display area NDA, wherein the display area DA displays images and the non-display area NDA does not display images. The display apparatus 1 may provide images by using light emitted from a plurality of pixels P arranged in the display area DA.

In FIG. 1, the display apparatus 1 includes the display area DA having a square shape, but one or more embodiments are not limited thereto. The display area DA may have a circular shape, an elliptical shape, or a polygonal shape such as a triangle, a pentagon, etc.

Hereinafter, an organic light-emitting display apparatus is described as an example of the display apparatus 1 according to an embodiment, but the display apparatus 1 of the disclosure is not limited thereto. In an embodiment, the display apparatus 1 may be an inorganic light-emitting display, a quantum dot light-emitting display, etc., and/or one or more other various suitable display apparatuses driven by various suitable methods. Also, the display apparatus 1 of FIG. 1 includes a flat panel display apparatus, but the display apparatus 1 may be of various types, e.g., a flexible display apparatus, a foldable display apparatus, a rollable display apparatus, etc.

Figure 2:
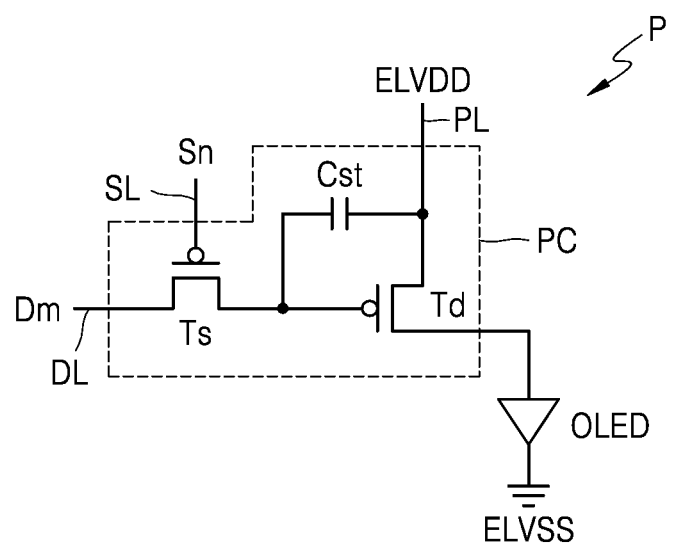
FIG. 2 is an equivalent circuit diagram of a pixel in the display apparatus of the embodiment.

FIG. 2 is an equivalent circuit diagram of a pixel in the display apparatus 1 of the embodiment.

A pixel circuit PC includes a driving thin film transistor T1, a switching thin film transistor T2, and a storage capacitor Cst. The switching thin film transistor T2 is connected to a scan line SL and a data line DL and transfers a data signal Dm input through the data line DL to the driving thin film transistor T1 according to a scan signal Sn input through the scan line SL.

The storage capacitor Cst is connected to the switching thin film transistor T2 and a driving voltage line PL and stores a voltage corresponding to a difference between a voltage transferred from the switching thin film transistor T2 and a first power voltage ELVDD (or a driving voltage) supplied to the driving voltage line PL.

The driving thin film transistor T1 is connected to the driving voltage line PL and the storage capacitor Cst and may control a driving current flowing from the driving voltage line PL to an organic light-emitting diode OLED in response to the voltage value stored in the storage capacitor Cst. The organic light-emitting diode OLED may emit light having a set or predetermined luminance according to the driving current.

FIG. 2 shows an example in which the pixel circuit PC includes two thin film transistors and one storage capacitor, but one or more embodiments are not limited thereto. In an alternative embodiment, the pixel circuit PC may include seven thin film transistors and one storage capacitor.

Figure 3:
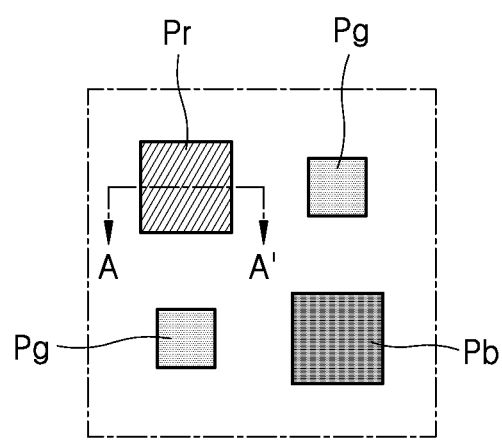
FIG. 3 is a diagram showing a structure in a pixel that may be included in the display apparatus according to the embodiment.

FIG. 3 is a diagram showing a structure in a pixel in the display apparatus 1 according to the embodiment.

Referring to FIG. 3, the display area DA may include at least one pixel. A pixel may include a sub-pixel Pr emitting red light, a sub-pixel Pg emitting green light, and a sub-pixel Pb emitting blue light. FIG. 3 shows a Pentile-type sub-pixel, but the sub-pixel may have one or more various suitable shapes, e.g., a stripe shape, etc. Also, FIG. 3 shows that one pixel includes four sub-pixels, but the number of sub-pixels may vary depending on a resolution of the display area DA.

Figure 4:
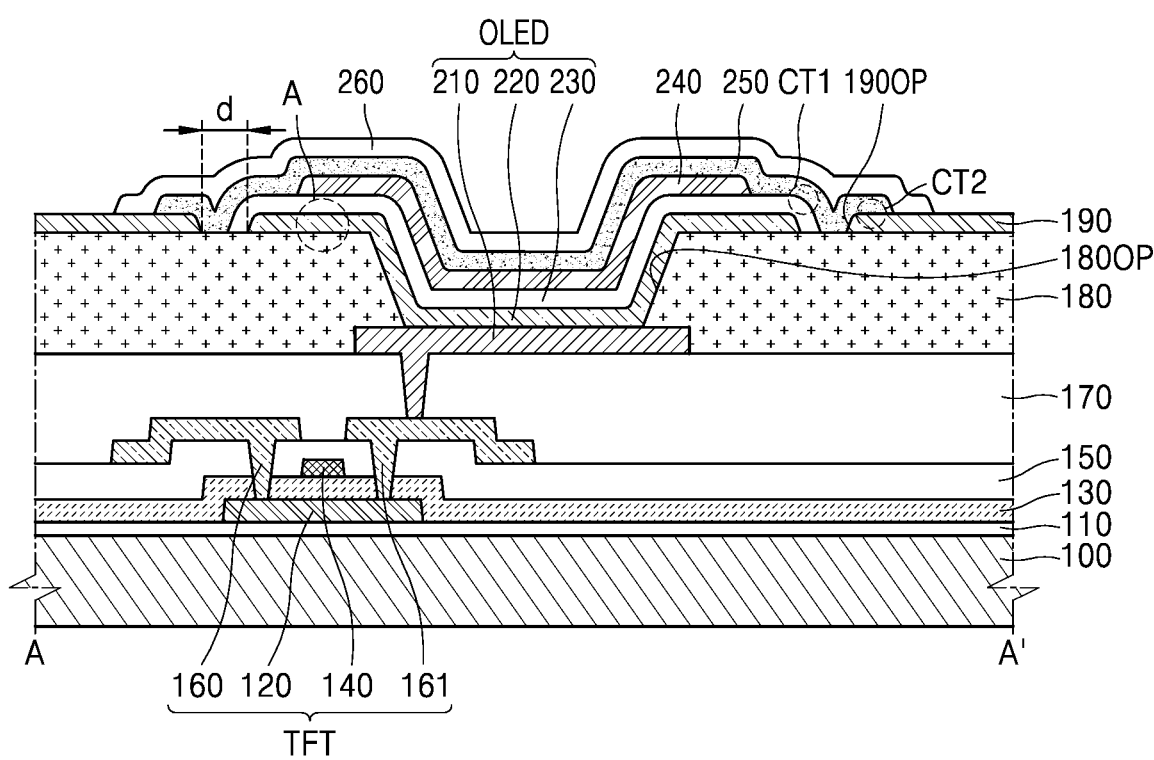
FIG. 4 is a cross-sectional view of a display apparatus according to an embodiment.
Figure 5:
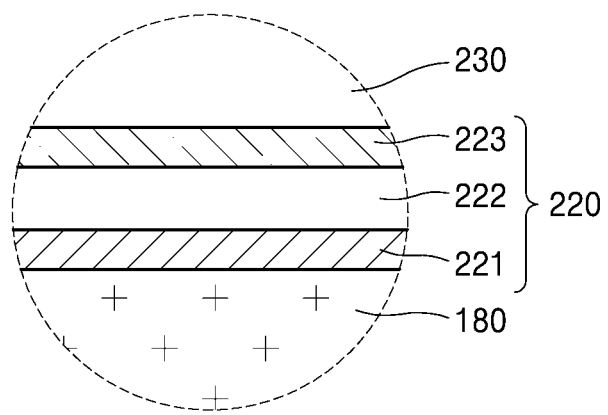
FIG. 5 is an enlarged view of a region A in FIG. 4.
Figure 6:
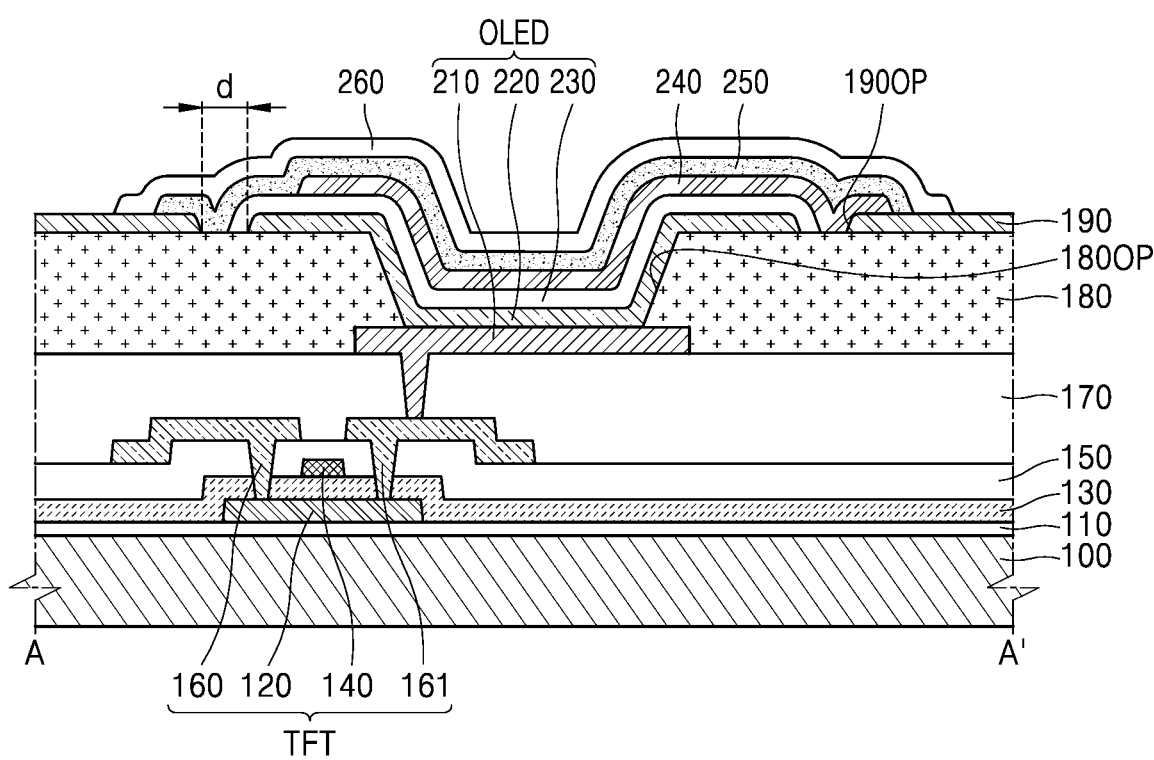
FIG. 6 is a cross-sectional view of a display apparatus according to an embodiment.

FIG. 4 is a cross-sectional view of the display apparatus 1 according to an embodiment, FIG. 5 is an enlarged view of a region A of FIG. 4, and FIG. 6 is a cross-sectional view of the display apparatus 1 according to an embodiment.

Referring to FIG. 4, the display apparatus 1 includes a substrate 100, a pixel electrode 210 on the substrate 100, a pixel defining layer 180 on the pixel electrode 210, wherein the pixel defining layer 180 has a first opening 180OP that exposes a central portion of the pixel electrode 210, an auxiliary electrode 190 on the pixel defining layer 180, an intermediate layer 220 on the pixel electrode 210, an opposite electrode 230 facing the pixel electrode 210 with the intermediate layer 220 therebetween, a first protective layer 240 on the opposite electrode 230, a contact electrode 250 on the first protective layer 240, wherein the contact electrode 250 electrically contacts the auxiliary electrode 190 and the opposite electrode 230, and a second protective layer 260 on the contact electrode 250.

The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, cellulose acetate propionate, etc. The substrate 100 including the polymer resin may be flexible, rollable, or bendable. The substrate 100 may have a multi-layered structure including a layer including the polymer resin and an inorganic layer.

A buffer layer 110 is located on the substrate 100 to reduce or block infiltration of impurities, moisture, or external air from a lower portion of the substrate 100 and to provide a flat surface on the substrate 100. The buffer layer 110 may include an inorganic material such as an oxide and/or nitride material, an organic material, and/or an inorganic-organic composite material, and may have a single-layered or multi-layered structure including the inorganic material and the organic material. A barrier layer for preventing or blocking infiltration of external air may be further provided between the substrate 100 and the buffer layer 110.

The active layer 120 may be arranged on the buffer layer 110. The active layer 120 may include oxide semiconductor and/or silicon semiconductor. When the active layer 120 includes oxide semiconductor, the active layer 120 may include oxide of at least one material selected from the group consisting of, for example, indium (In), gallium (Ga), tin (Sn), zirconium (Zr), vanadium (V), hafnium (Hf), cadmium (Cd), germanium (Ge), chrome (Cr), titanium (Ti), and zinc (Zn). For example, the active layer 120 may include an InSnZnO (ITZO) active layer, an InGaZnO (IGZO) active layer, etc. When the active layer 120 includes silicon semi-conductor, the active layer 120 may include, e.g., amorphous silicon (a-Si) and/or low temperature polysilicon (LTPS).

A gate electrode 140 may be arranged on the active layer 120 with a first insulating layer 130 therebetween. For example, the gate electrode 140 may have a single- or multi-layered structure including one or more metals selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 140 may be connected to a gate line that applies an electrical signal to the gate electrode 140.

A source electrode 160 and/or a drain electrode 161 may be arranged on the gate electrode 140 with a second insulating layer 150 therebetween. The source electrode 160 and/or the drain electrode 161 may be electrically connected to the active layer 120 via contact holes formed in the second insulating layer 150 and the first insulating layer 130.

Referring back to FIG. 4, a third insulating layer 170 may be arranged on the second insulating layer 150. In FIG. 4, the third insulating layer 170 is shown to have a single-layered structure, but the third insulating layer 170 may have a multi-layered structure. The third insulating layer 170 planarizes an upper surface of the pixel circuit PC, so as to planarize a surface on which the organic light-emitting diode OLED is to be disposed.

The third insulating layer 170 may include universal polymer(s) (e.g., benzocyclobutene (BCB), polyimide, hexamethyldisiloxane (HMDSO), polymethylmethacrylate (PMMA), and/or polystyrene (PS)), and/or polymer derivative(s) having phenol groups, acryl-based polymer, imide-based polymer, aryl ether-based polymer, amide-based polymer, fluoride-based polymer, p-xylene-based polymer, vinyl alcohol-based polymer, and/or a blend thereof. The third insulating layer 170 may include an inorganic material. The third insulating layer 170 may include an insulating material such as silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). When the third insulating layer 170 includes an inorganic material, a chemical planarization polishing may be performed if necessary. Alternatively, the third insulating layer 170 may include both an organic material and an inorganic material.

The pixel electrode 210 may be arranged on the third insulating layer 170. The pixel electrode 210 may include a (semi-) transmissive electrode or a reflective electrode. In some embodiments, the pixel electrode 210 may include a reflective layer including Ag, Mg, Al, Pt, Pd, Au, Ni, Nd, Ir, Cr, and/or a compound thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide, indium gallium oxide (IGO), and aluminum zinc oxide. In some embodiments, the pixel electrode 210 may include a stack structure including ITO/Ag/ITO.

The pixel defining layer 180 may be arranged on the third insulating layer 170, and the pixel defining layer 180 includes the first opening 180OP that exposes the central portion of the pixel electrode 210 to define a light-emitting region of the pixel. Also, the pixel defining layer 180 increases a distance between an edge of the pixel electrode 210 and the opposite electrode 230 on the pixel electrode 210 to prevent or reduce generation of an arc at the edge of the pixel electrode 210. The pixel defining layer 180 may include, for example, an organic insulating material such as polyimide, polyamide, an acrylic resin, BCB, HMDSO, and/or a phenol resin, and may be obtained by spin coating, etc.

The auxiliary electrode 190 may be arranged on the pixel defining layer 180. The auxiliary electrode 190 is arranged on the pixel defining layer 180 and has a second opening 190OP that exposes at least partially an upper surface of the pixel defining layer 180. The second opening 190OP may be larger than the first opening 180OP.

The auxiliary electrode 190 may include a metal layer including low-resistive metal, e.g., molybdenum (Mo), titanium (Ti), copper (Cu), aluminum (Al), and/or an alloy thereof. Also, the auxiliary electrode 190 may further include a transparent conductive oxide layer such as ITO on and/or under the above metal layer.

The intermediate layer 220 may be arranged on an exposed portion of the pixel electrode 210, which is exposed via the pixel defining layer 180, and an end of the auxiliary electrode 190 and an end of the intermediate layer 220 may be spaced apart from each other by a set or predetermined distance d on the pixel defining layer 180.

As shown in FIG. 5, the intermediate layer 220 may include an emission layer 222, and a first functional layer 221 and a second functional layer 223 may be respectively under and over (on) the emission layer 222.

The emission layer 222 may include an organic material including a fluorescent or phosphor material emitting red, green, blue, or white light. The emission layer 222 may include low-molecular weight organic materials or polymer materials. When the intermediate layer 220 includes a low-molecular weight material, the intermediate layer 220 may have a single- or multi-layered structure including a hole injection layer (HIL), a hole transport layer (HTL), the emission layer (EML) 222, an electron transport layer (ETL), an electron injection layer (EIL), etc. The HTL and the HIL may correspond to the first functional layer 221 of FIG. 5, and the ETL and the EIL may correspond to the second functional layer 223.

When the intermediate layer 220 includes a polymer material, the intermediate layer 220 may have a structure including the first functional layer 221 including an HTL and the emission layer 222.

A plurality of pixel electrodes 210 may be arranged, and the intermediate layer 220 may correspond to each of the plurality of pixel electrodes 210. However, one or more embodiments are not limited thereto. The intermediate layer 220 may be suitably modified, that is, may be arranged throughout the plurality of pixel electrodes 210. In an embodiment, the emission layer 222 may correspond to each of the plurality of pixel electrodes 210, and functional layer(s) except for the emission layer 222 may be provided integrally throughout the plurality of pixel electrodes 210.

The opposite electrode 230 may be arranged on the intermediate layer 220. The opposite electrode 230 is arranged on the intermediate layer 220, and the opposite electrode 230 may entirely cover the intermediate layer 220 or may be arranged to at least partially expose opposite end portions of the intermediate layer 220.

The opposite electrode 230 may include a transmissive electrode or a reflective electrode. In some embodiments, the opposite electrode 230 may include a transparent or a semi-transparent electrode, and may be provided as a metal thin film including Li, Ca, LiF/Ca, LiF/Al, Al, Ag, Mg, and/or a compound thereof having a small work function.

Also, a transparent conductive oxide (TCO) such as ITO, IZO, ZnO, and/or $In_2O_3$ may be further provided over the metal thin film.

In an embodiment, the opposite electrode 230 may be arranged on the intermediate layer 220 to a thickness of about 1 nm to about 20 nm.

When the pixel electrode 210 includes a reflective electrode and the opposite electrode 230 includes a transmissive electrode, light emitted from the intermediate layer 220 is emitted towards the opposite electrode 230 and the display apparatus 1 is a top emission type.

In an embodiment, when the pixel electrode 210 includes a transparent or a semi-transparent electrode and the opposite electrode 230 includes a reflective electrode, the light emitted from the intermediate layer 220 is emitted towards the substrate 100 and the display apparatus 1 is a bottom emission type. However, one or more embodiments are not limited thereto, that is, the display apparatus 1 according to an embodiment may be a dual-emission type that emits light towards both the front and back surfaces.

In order to manufacture an organic light-emitting diode OLED having a high resolution, when a deposition process is performed with a fine metal mask (FMM) in close contact with a substrate, an upper portion of a pixel electrode may be damaged.

To address this, a method of manufacturing an organic light-emitting diode OLED through a photo-patterning process, instead of using an FMM, has been suggested, but according to the above method, the organic light-emitting diode OLED may be damaged during the forming of a contact electrode.

Therefore, according to the embodiments, a first protective layer may be arranged on an opposite electrode before forming the contact electrode by which an auxiliary electrode and the opposite electrode may be electrically connected with (electrically contact) each other, and thus, the organic light-emitting diode OLED may be protected from damage that may occur during the forming of the contact electrode.

A first protective layer 240 may be arranged on the opposite electrode 230. The first protective layer 240 on the opposite electrode 230 may at least partially expose opposite end portions of the opposite electrode 230. For example, the first protective layer 240 partially exposes the opposite electrode 230 at opposite ends of the opposite electrode 230.

The first protective layer 240 may protect the organic light-emitting diode OLED against damage that may occur during a deposition of the contact electrode 250. The first protective layer 240 may include an inorganic material having an optical bandgap of 3 eV or greater and may include metal oxide having a dielectric constant of 10 or greater. The first protective layer 240 may include, for example, at least one selected from the group consisting of copper oxide ($CuO_x$), molybdenum oxide ($MoO_x$), tungsten oxide ($WO_x$), zinc oxide (ZnO), magnesium oxide (MgO), silicon oxide ($SiO_x$), aluminum oxide ($Al_2O_3$), silicon oxynitride (SiON), silicon nitride ($SiN_x$), niobium oxide ($Nb_2O_5$), and gallium oxide ($Ga_xO_y$).

Also, the first protective layer 240 may include a light transmitting organic material. The first protective layer 240 may include, for example, at least one selected from the group consisting of tertiary aromatic amine derivatives including copper phthalocyanine, copper tetramethyl phthalocyanine, zinc phthalocyanine, titanium oxide phthalocyanine, magnesium phthalocyanine, etc., indolocarbazole derivatives, and porphyrin derivatives. In an alternative embodiment, the first protective layer 240 may include both an inorganic material and an organic material.

The first protective layer 240 according to the embodiment may be arranged on the opposite electrode 230 to a thickness of about 1 nm to about 100 nm.

Referring to FIG. 4, the first protective layer 240 may be arranged on the opposite electrode 230 while at least partially exposing the opposite end portions of the opposite electrode 230, and referring to FIG. 6, the first protective layer 240 may be arranged on the opposite electrode 230 while exposing one end of the opposite electrode 230.

The contact electrode 250 may be arranged on the first protective layer 240, wherein the contact electrode 250 may be electrically connected with (electrically contact) the auxiliary electrode 190 and the opposite electrode 230. A material of the opposite electrode 230 is introduced at a first incident angle and a material of the contact electrode 250 is introduced at a second incident angle that is greater than the first incident angle, and thus, the contact electrode 250 may cover the opposite electrode 230. For example, in order for the contact electrode 250 to cover the opposite electrode 230, the material of the contact electrode 250 may be deposited on the first protective layer 240 by a sputtering method.

Referring to FIG. 4, the contact electrode 250 may directly and electrically contact the opposite electrode 230, at the opposite end portions of the opposite electrode 230 that are at least partially exposed (at CT1), and may also directly and electrically contact the auxiliary electrode 190 (at CT2). Thus, the contact electrode 250 may allow the opposite electrode 230 and the auxiliary electrode 190 to electrically contact each other.

In order to reduce a decrease in the light-emitting efficiency, the contact electrode 250 may include a material having an excellent conductive property and an excellent visible ray transmitting property. Therefore, the contact electrode 250 may include a light-transmitting conductive material having excellent conductive and visible ray transmitting properties. According to the embodiment, the light-transmitting conductive material may include at least one selected from ITO, IZO, ZnO, indium oxide, IGO, and aluminum zinc oxide.

A second protective layer 260 may be arranged on the contact electrode 250. The second protective layer 260 may entirely cover the contact electrode 250, and may be arranged on the contact electrode 250 and at least partially cover the auxiliary electrode 190.

The second protective layer 260 may prevent or protect from reduction in the light-emitting efficiency of the organic light-emitting diode OLED due to oxidation of the opposite electrode 230 and the contact electrode 250 and may also prevent or reduce damage to the organic light-emitting diode OLED that is previously manufactured during manufacturing of an organic light-emitting diode OLED including an emission layer emitting light of different colors.

The second protective layer 260 may include, for example, at least one selected from the group consisting of copper oxide ($CuO_x$), molybdenum oxide ($MoO_x$), tungsten oxide ($WO_x$), zinc oxide (ZnO), magnesium oxide (MgO), silicon oxide ($SiO_x$), aluminum oxide ($Al_2O_3$), silicon oxynitride (SiON), silicon nitride ($SiN_x$), niobium oxide ($Nb_2O_5$), and/or gallium oxide ($Ga_xO_y$). In an alternative embodiment, the second protective layer 260 may include both an inorganic material and an organic material.

FIGS. 7 to 13B are cross-sectional views illustrating some of manufacturing processes of a display apparatus 1 according to an embodiment.

Hereinafter, a method of manufacturing the display apparatus 1 will be described in a processing order with reference to FIGS. 7 to 13B.

Referring to FIGS. 7 to 13B, the method of manufacturing the display apparatus 1 according to the embodiment includes preparing the substrate 100, forming the pixel electrode 210 on the substrate 100, forming the pixel defining layer 180 on the pixel electrode 210, wherein the pixel defining layer 180 has the first opening 180OP that exposes a central portion of the pixel electrode 210, forming the auxiliary electrode 190 on the pixel defining layer 180, wherein the auxiliary electrode 190 has the second opening 190OP that is larger than the first opening 180OP, forming a lift-off layer 310 on the auxiliary electrode 190, wherein the lift-off layer 310 has a third opening 310OP, and a mask layer 320 on the lift-off layer 310, wherein the mask layer 320 has a fourth opening 320OP that is smaller than the third opening 310OP, forming the intermediate layer 220 on the pixel electrode 210 via the fourth opening 320OP, forming the opposite electrode 230 on the intermediate layer 220 through the fourth opening 320OP, forming the first protective layer 240 on the opposite electrode 230 through the fourth opening 320OP, forming the contact electrode 250 on the first protective layer 240 through the fourth opening 320OP, wherein the contact electrode 250 electrically contacts the auxiliary electrode 190 and the opposite electrode 230, forming the second protective layer 260 on the contact electrode 250 through the fourth opening 320OP, and removing the lift-off layer 310 and the mask layer 320.

In the preparing of the substrate 100, a substrate composition is applied onto a carrier substrate and is cured to form the substrate 100. For example, a polyamic acid composition solution may be cured to form a polyimide (PI) substrate.

Figure 7:
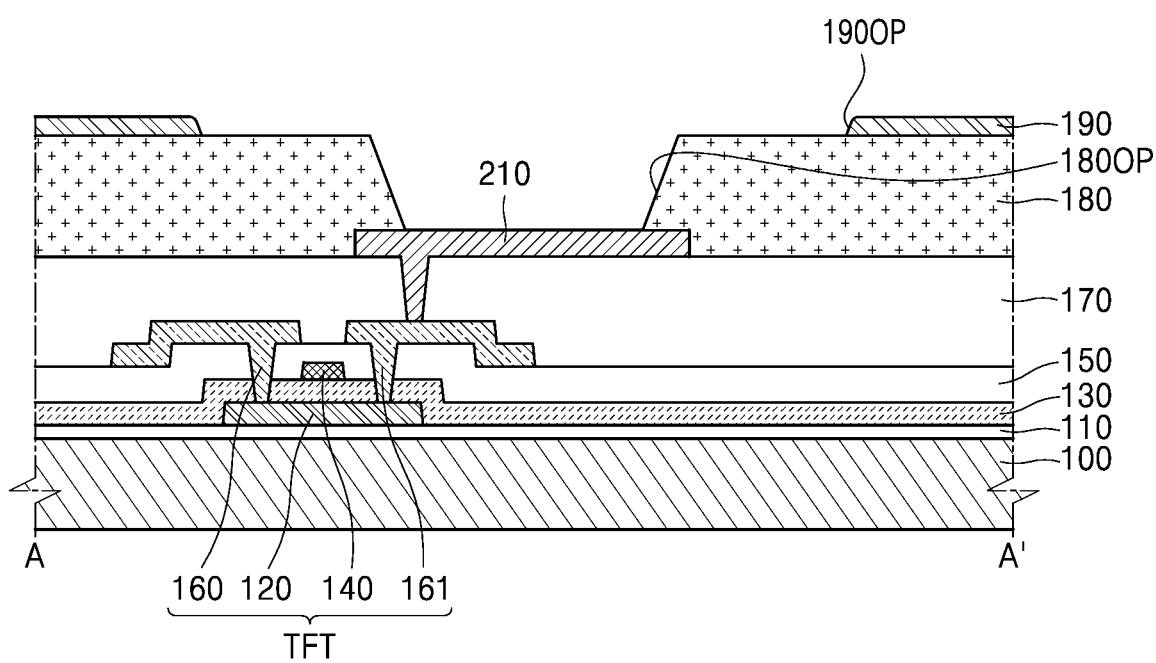
FIGS. 7 to 13B are views illustrating some of manufacturing processes of a display apparatus according to an embodiment.

FIG. 7 is a cross-sectional view showing some of the manufacturing processes of the display apparatus 1 according to the embodiment.

Referring to FIG. 7, a buffer layer 110, an active layer 120, a first insulating layer 130, a gate electrode 140, a second insulating layer 150, a source electrode 160, a drain electrode 161, a third insulating layer 170, the pixel electrode 210, and the pixel defining layer 180 having the opening exposing the center portion of the pixel electrode 210 may be on the substrate 100. The above process may be performed through a photolithography process that is suitable in the art, and thus, detailed descriptions thereof are not provided.

After forming the pixel defining layer 180, a process of forming the auxiliary electrode 190 on the pixel defining layer 180 may be further performed. The auxiliary electrode 190 is directly formed on an upper surface of the pixel defining layer 180 and in direct contact with the upper surface of the pixel defining layer 180.

The auxiliary electrode 190 may include a metal layer including low-resistive metal, e.g., molybdenum (Mo), titanium (Ti), copper (Cu), aluminum (Al), and an alloy thereof. Also, the auxiliary electrode 190 may further include a transparent conductive oxide layer such as ITO on and/or under the above metal layer.

Figure 8:
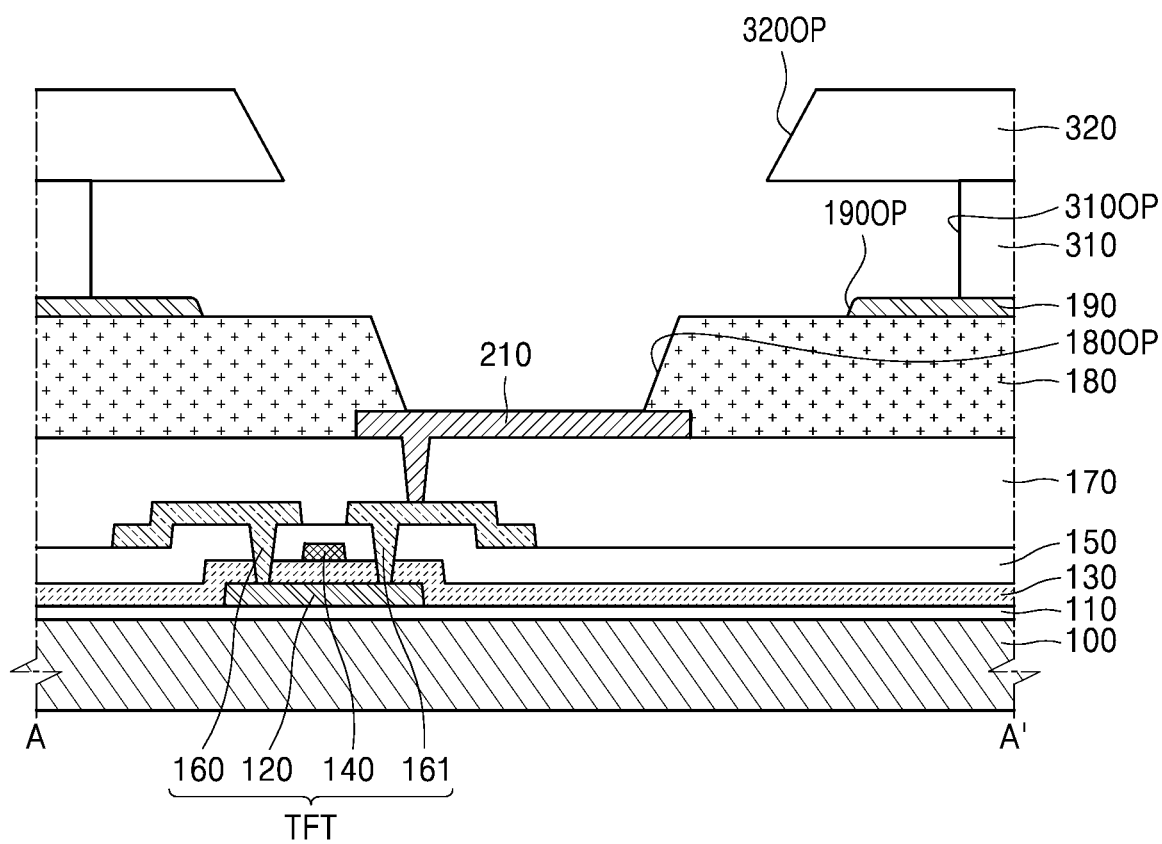

FIG. 8 is a cross-sectional view showing some of the manufacturing processes of the display apparatus 1 according to the embodiment.

Referring to FIG. 8, after forming the auxiliary electrode 190, a process of forming the lift-off layer 310 on the auxiliary electrode 190 and the mask layer 320 having the fourth opening 320OP corresponding to the first opening 180OP on the lift-off layer 310 may be further performed.

The lift-off layer 310 and the mask layer 320 may respectively include the third opening 310OP and the fourth opening 320OP corresponding to the pixel electrode 210, and thus, expose the pixel electrode 210, and the third opening 310OP may be larger (wider) than the fourth opening 320OP. That is, the mask layer 320 may protrude towards the first opening 180OP from the lift-off layer 310, that is, may protrude to provide an undercut shape.

In an embodiment, a non-photosensitive material layer and a photosensitive resin layer are formed on the substrate 100, on which the auxiliary electrode 190 is arranged, and the photosensitive resin layer is partially exposed and developed to form the mask layer 320 having the fourth opening 320OP. After that, the non-photosensitive material layer is selectively removed through the fourth opening 320OP of the mask layer 320 to form the lift-off layer 310 having the third opening 310OP.

The non-photosensitive material layer may include a fluorine-based resin. For example, the non-photosensitive material layer may include 75 to 95 wt % of fluoroether, in which a part of hydrogen is replaced with fluorine in an ether structure, and 2 to 25 wt % of resin polymer, but is not limited thereto. When the non-photosensitive material layer includes the above material, the lift-off layer 310 having the third opening 310OP may be formed by partially removing the non-photosensitive material layer by using a stripper, etc., in the form of a solution containing hydrofluoroether.

Figure 9A:
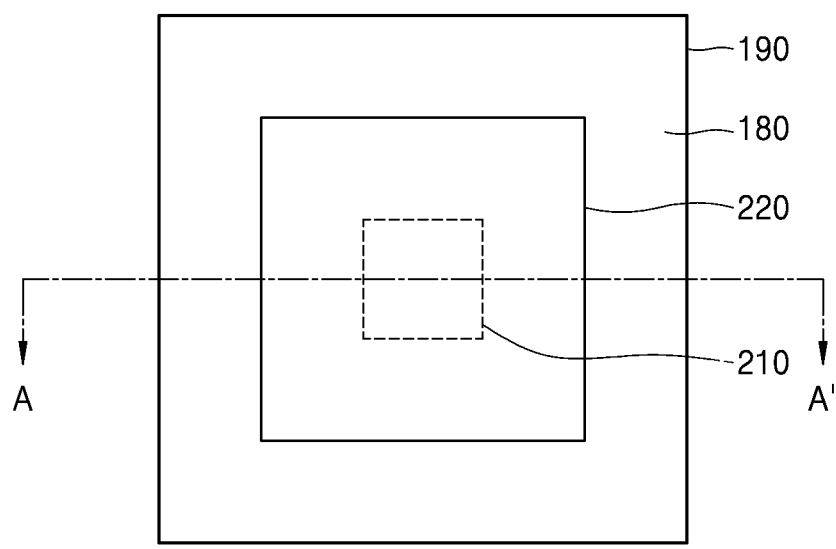
Figure 9B:
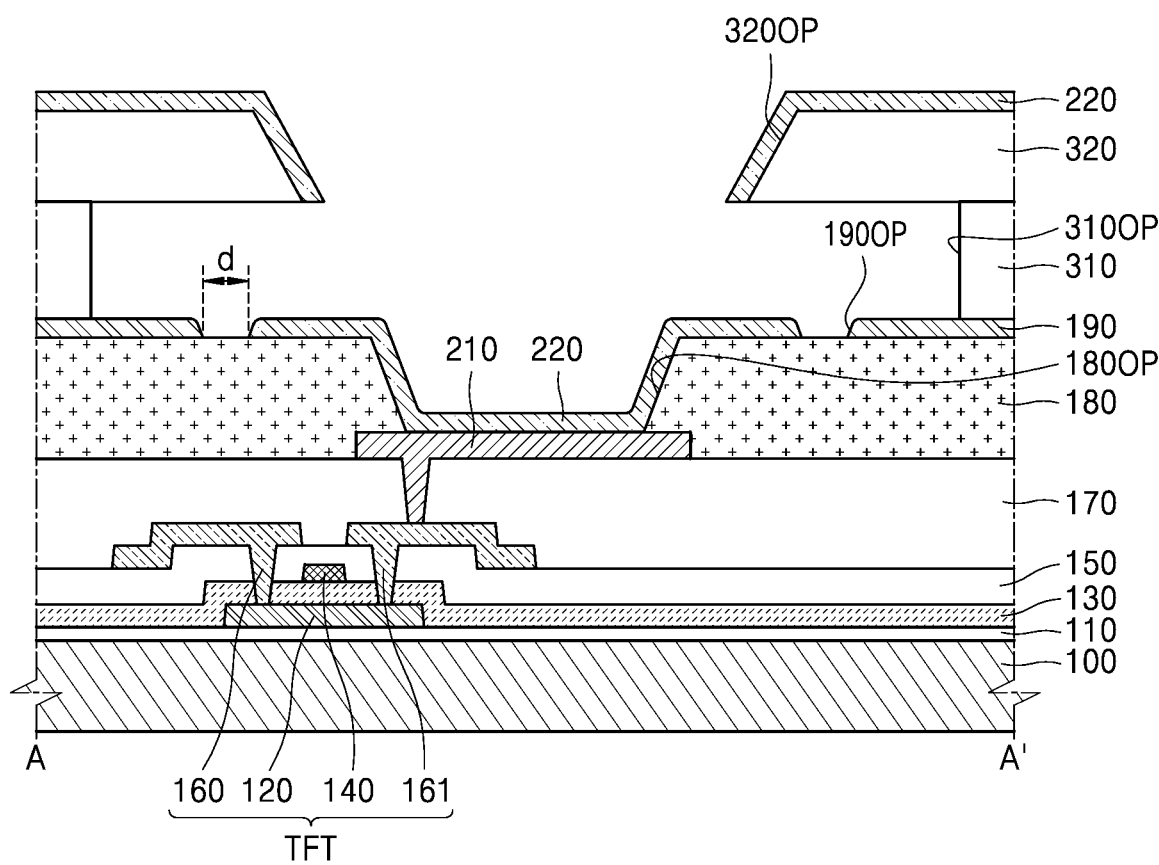

FIGS. 9A and 9B are respectively a plan view and a cross-sectional view illustrating some of the manufacturing processes of the display apparatus 1 according to the embodiment, and show the process next to that of FIG. 8.

Referring to FIGS. 9A and 9B, after forming the lift-off layer 310 and the mask layer 320, a process of forming the intermediate layer 220 on the pixel electrode 210 through the fourth opening 320OP may be performed.

The intermediate layer 220 may be on the pixel electrode 210 through the fourth opening 320OP provided on the mask layer 320. In more detail, the material of the intermediate layer 220 is introduced through the fourth opening 320OP of the mask layer 320, and thus, the intermediate layer 220 may be on the pixel electrode 210 that is exposed by the pixel defining layer 180, and an end of the auxiliary electrode 190 and an end of the intermediate layer 220 may be spaced a set or predetermined distance d from each other on the pixel defining layer 180.

Here, in the intermediate layer 220 (FIG. 5), the emission layer 222 may include an organic material including a fluorescent or phosphor material emitting red, green, blue, or white light. The emission layer (EML) 222 may include low-molecular weight organic material(s) and/or polymer material(s). When the intermediate layer 220 includes a low-molecular weight material, the intermediate layer 220 may have a single- or multi-layered structure including a hole injection layer (HIL), a hole transport layer (HTL), the EML 222, an electron transport layer (ETL), an electron injection layer (EIL), etc. The HTL and the HIL correspond to the first functional layer 221 of FIG. 5, and the ETL and the EIL may correspond to the second functional layer 223.

When the intermediate layer 220 includes a polymer material, the intermediate layer 220 may have a structure including the first functional layer 221 including the HTL and the emission layer 222.

The material of the intermediate layer 220 may not only be deposited on the pixel electrode 210, but also on the mask layer 320, and thus, the fourth opening 320OP may become narrower as the manufacturing processes are performed.

Figure 10A:
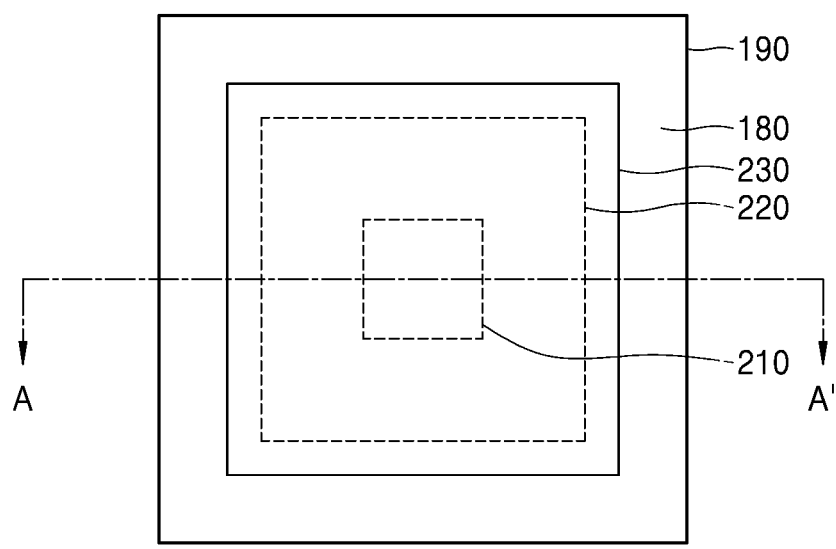
Figure 10B:
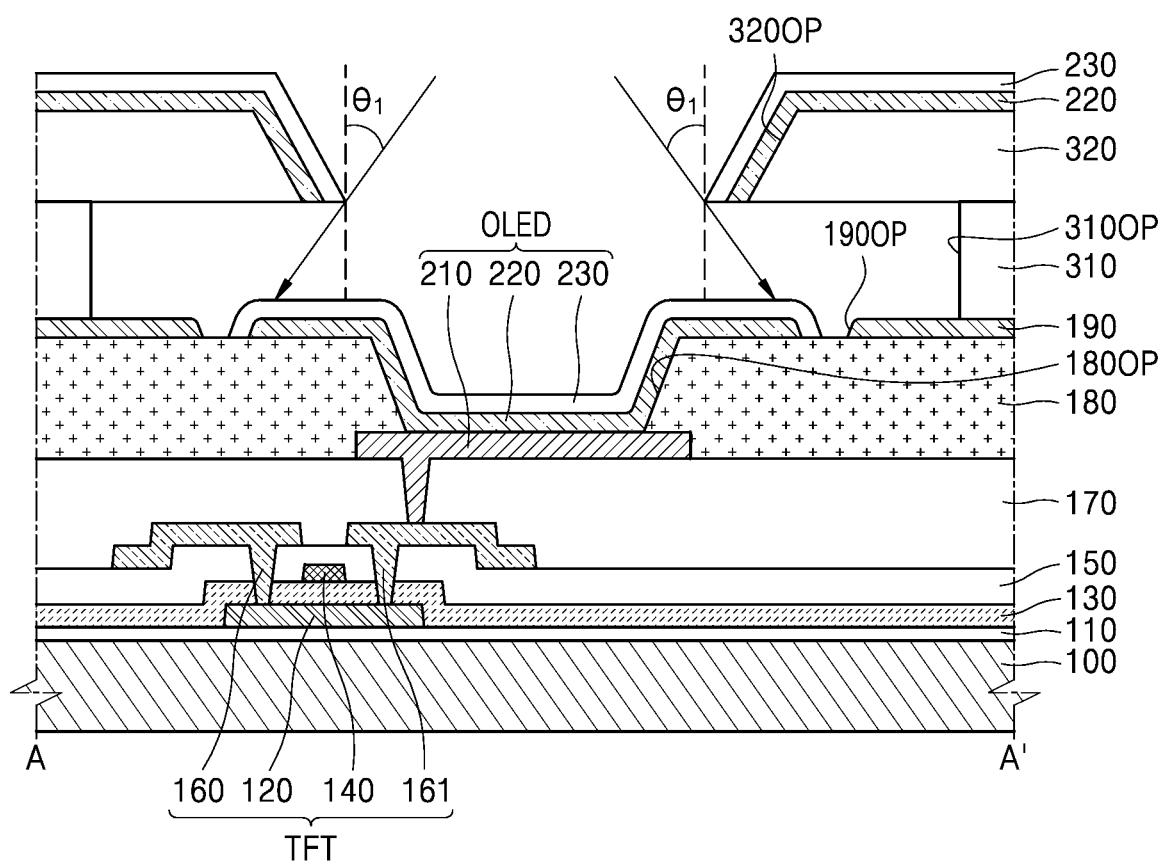

FIGS. 10A and 10B are respectively a plan view and a cross-sectional view illustrating some of the manufacturing processes of the display apparatus 1 according to the embodiment, and show the process next to that of FIGS. 9A and 9B.

Referring to FIGS. 10A and 10B, after the forming of the intermediate layer 220, a process of forming the opposite electrode 230 on the intermediate layer 220 through the fourth opening 320OP may be further performed. The opposite electrode 230 is arranged on the intermediate layer 220, and the opposite electrode 230 may entirely cover the intermediate layer 220 or may at least partially expose opposite end portions of the intermediate layer 220.

The opposite electrode 230 may include a metal thin film having a low work function. For example, the opposite electrode 230 may include Ag, Mg, Al, Pt, Pd, Au, Ni, Nd, Ir, Cr, lithium (Li), calcium (Ca), and/or an alloy thereof. In an embodiment, the opposite electrode 230 may include Al, Ag, and/or an alloy (Mg:Ag) of Mg and Ag. In an embodiment, the opposite electrode 230 may include an alloy containing more Ag than Mg.

In an alternative embodiment, the opposite electrode 230 may further include, on the metal thin film, a transparent conductive oxide (TCO) layer such as ITO, IZO, ZnO, $In_2O_3$, etc.

In an embodiment, the opposite electrode 230 may be on the intermediate layer 220 to a thickness of about 1 nm to about 20 nm.

Figure 11A:
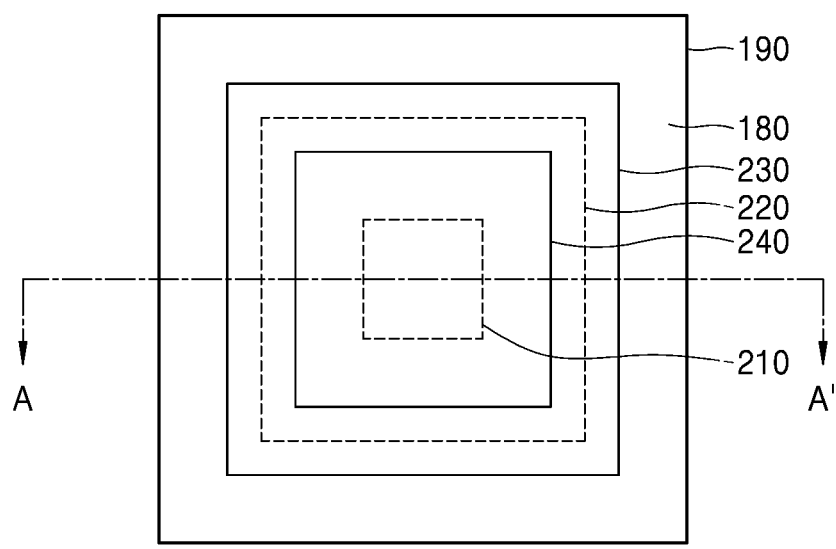
Figure 11B:
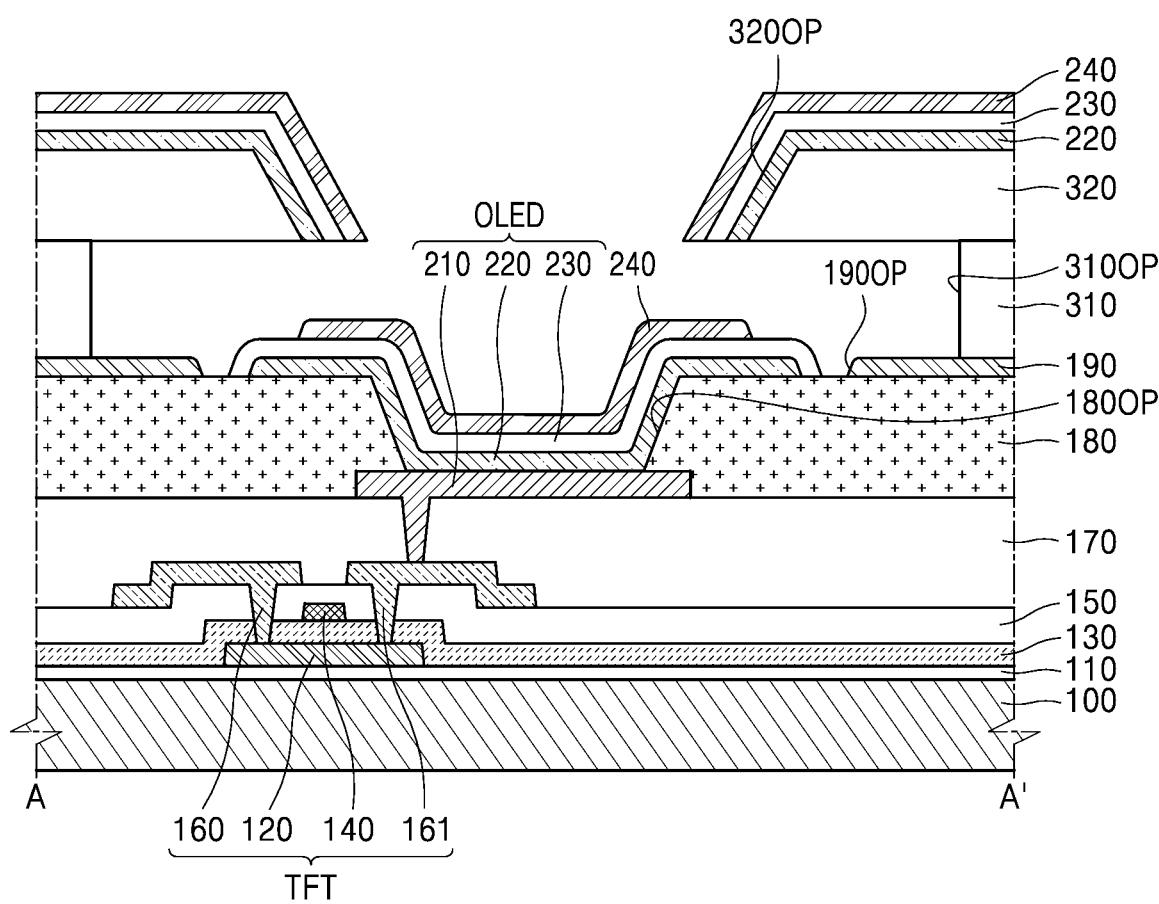

FIGS. 11A and 11B are respectively a plan view and a cross-sectional view illustrating some of the manufacturing processes of the display apparatus 1 according to the embodiment, and show the process next to that of FIGS. 10A and 10B.

Referring to FIGS. 11A and 11B, after the forming of the opposite electrode 230, a process of forming the first protective layer 240 on the opposite electrode 230 through the fourth opening 320OP may be further performed. The first protective layer 240 is arranged on the opposite electrode 230, and may at least partially expose opposite end portions of the opposite electrode 230.

The first protective layer 240 may protect the organic light-emitting diode OLED against damage that may occur during the forming of the contact electrode 250. The first protective layer 240 may include an inorganic material having an optical bandgap of 3 eV or greater and may include metal oxide having a dielectric constant of 10 or greater. The first protective layer 240 may include, for example, at least one selected from the group consisting of copper oxide ($CuO_x$), molybdenum oxide ($MoO_x$), tungsten oxide ($WO_x$), zinc oxide (ZnO), magnesium oxide (MgO), silicon oxide ($SiO_x$), aluminum oxide ($Al_2O_3$), silicon oxynitride (SiON), silicon nitride ($SiN_x$), niobium oxide ($Nb_2O_5$), and gallium oxide ($Ga_xO_y$).

Also, the first protective layer 240 may include a light-transmitting organic material. The first protective layer 240 may include, for example, at least one selected from the group consisting of tertiary aromatic amine derivatives (including copper phthalocyanine, copper tetramethyl phthalocyanine, zinc phthalocyanine, titanium oxide phthalocyanine, magnesium phthalocyanine, etc.), indolocarbazole derivatives, and porphyrin derivatives. In an alternative embodiment, the first protective layer 240 may include both an inorganic material and an organic material.

The first protective layer 240 according to the embodiment may be formed on the opposite electrode 230 through the fourth opening 320OP of the mask layer 320 to a thickness of 1 nm to 100 nm.

Figure 12A:
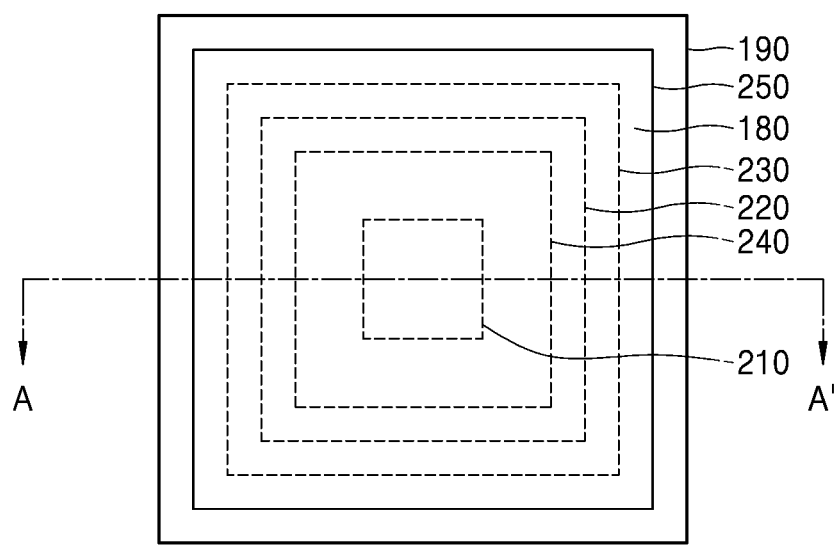
Figure 12B:
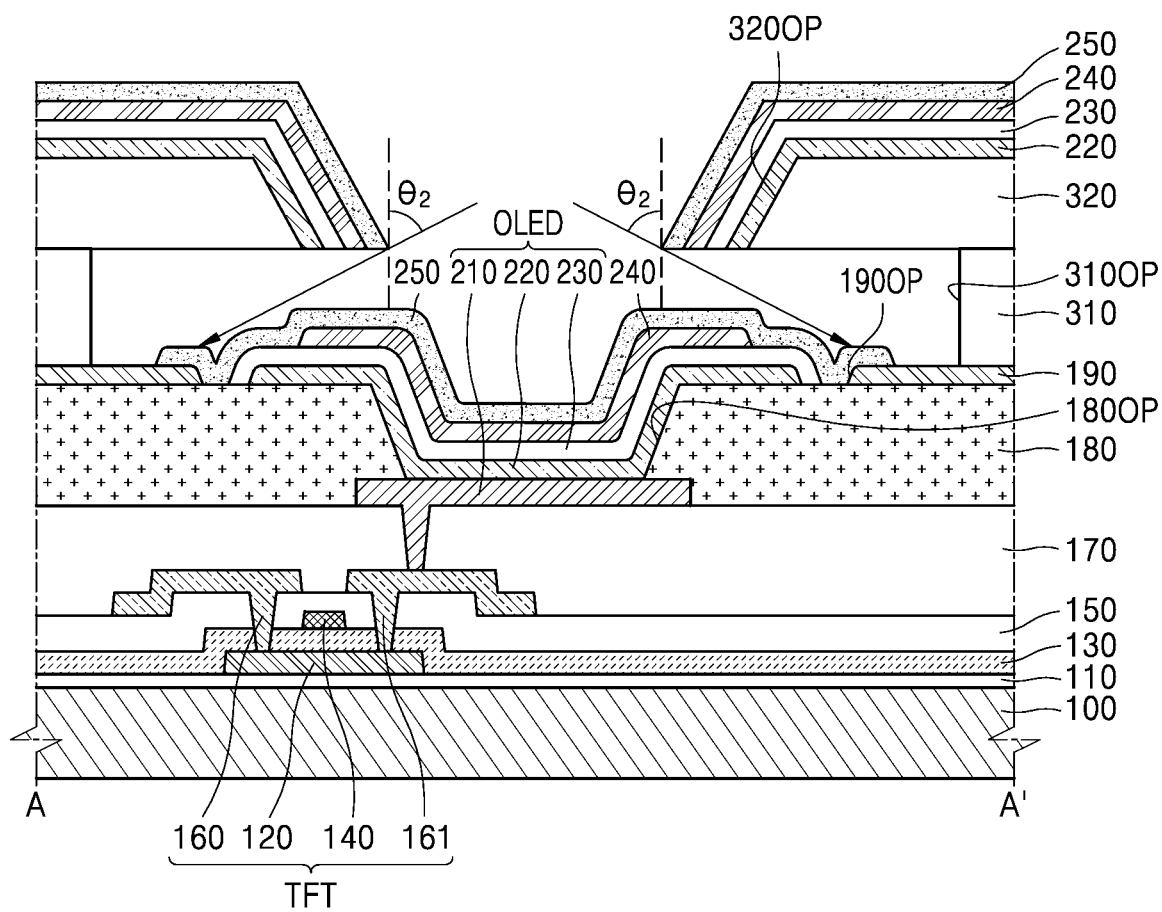

FIGS. 12A and 12B are respectively a plan view and a cross-sectional view illustrating some of the manufacturing processes of the display apparatus 1 according to the embodiment, and show the process next to that of FIGS. 11A and 11B.

Referring to FIGS. 12A and 12B, after the forming of the first protective layer 240, a process of forming the contact electrode 250 on the first protective layer 240 through the fourth opening 320OP may be further performed.

Referring to FIG. 10B, the material forming the opposite electrode 230 is introduced with a first incident angle $\theta_1$, and referring to FIG. 12B, the material forming the contact electrode 250 is introduced at a second incident angle $\theta_2$ that is greater than the first incident angle $\theta_1$, and thus, the contact electrode 250 may cover the opposite electrode 230, even at the opposite end portions of the opposite electrode 230 that are at least partially exposed by the first protective layer 240. For example, in order for the contact electrode 250 to cover the opposite electrode 230, the contact electrode 250 may be deposited on the first protective layer 240 by a sputtering method.

The contact electrode 250 is arranged on the first protective layer 240 and may directly and electrically contact the opposite electrode 230, at the opposite end portions of the opposite electrode 230 that are at least partially exposed by the first protective layer 240, and the auxiliary electrode 190. Thus, the contact electrode 250 may allow the opposite electrode 230 and the auxiliary electrode 190 to be electrically connected with (electrically contact) each other.

The contact electrode 250 may have excellent conductive properties and visible ray transmitting properties, in order to reduce a decrease in light-emitting efficiency. Therefore, the contact electrode 250 may include a light-transmitting conductive material having excellent conductive and visible ray transmitting properties. According to the present embodiment, the light-transmitting conductive material may include at least one selected from ITO, IZO, ZnO, $In_2O_3$, IGO, and AZO.

Figure 13A:
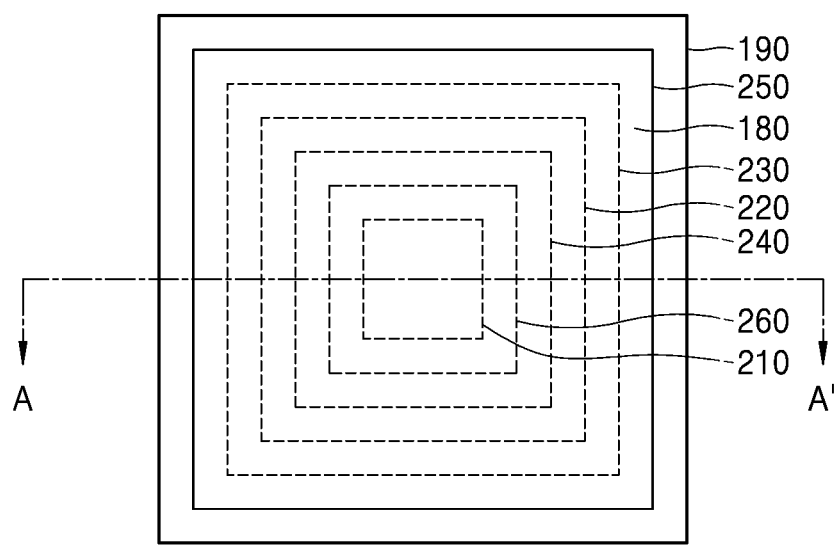
Figure 13B:
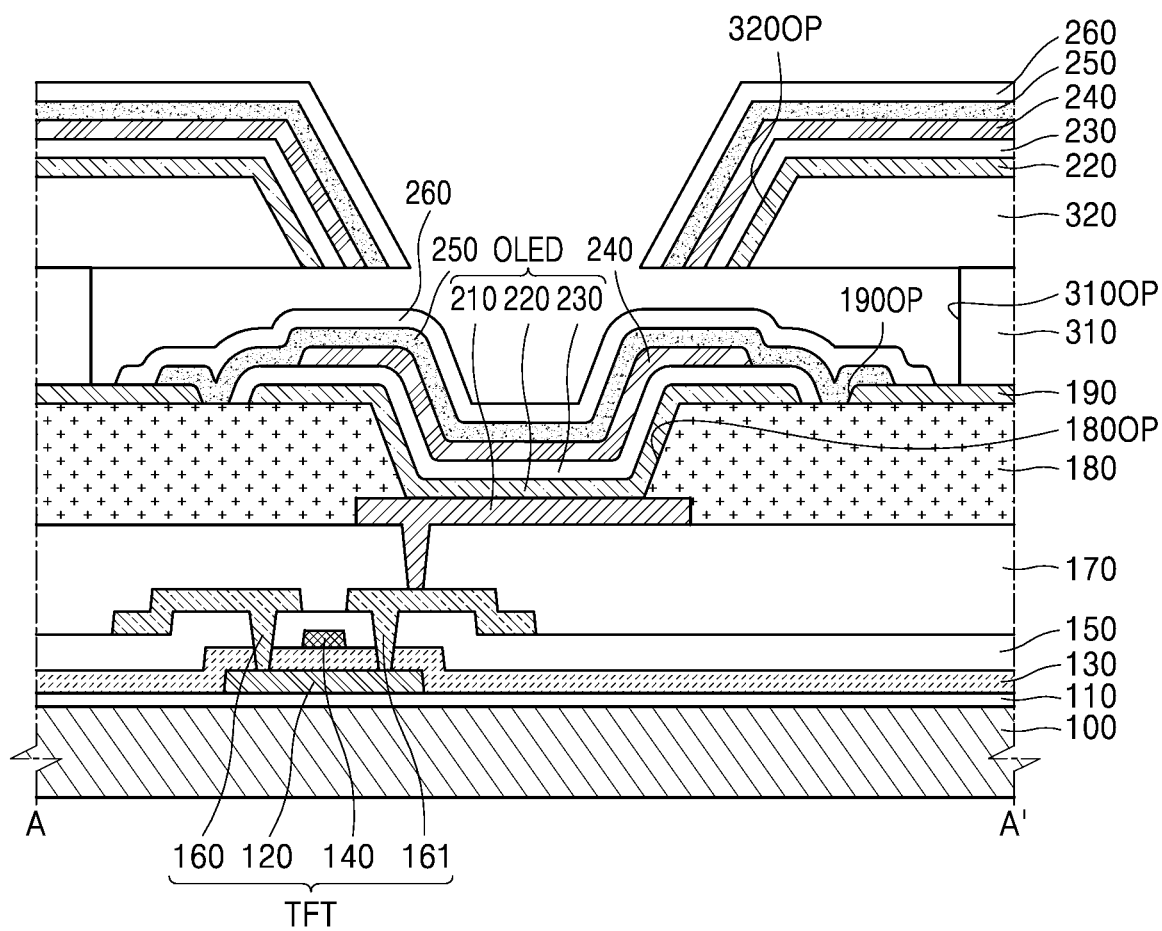

FIGS. 13A and 13B are respectively a plan view and a cross-sectional view illustrating some of the manufacturing processes of the display apparatus 1 according to the embodiment, and show the process next to that of FIGS. 12A and 12B.

Referring to FIGS. 13A and 13B, after the forming of the contact electrode 250, a process of forming the second protective layer 260 on the contact electrode 250 through the fourth opening 320OP may be further performed.

The second protective layer 260 may entirely cover the contact electrode 250 and be formed on the contact electrode 250 and at least partially cover the auxiliary electrode 190.

The second protective layer 260 is arranged on the contact electrode 250 to prevent reduction in the light-emitting efficiency of the organic light-emitting diode OLED due to oxidation of the opposite electrode 230 and the contact electrode 250, and may prevent or reduce damage to the organic light-emitting diode OLED that is previously manufactured during manufacturing of an organic light-emitting diode OLED emitting light of different colors.

The second protective layer 260 may include, for example, at least one selected from the group consisting of copper oxide ($CuO_x$), molybdenum oxide ($MoO_x$), tungsten oxide ($WO_x$), zinc oxide (ZnO), magnesium oxide (MgO), silicon oxide ($SiO_x$), aluminum oxide ($Al_2O_3$), silicon oxynitride (SiON), silicon nitride ($SiN_x$), niobium oxide ($Nb_2O_5$), and gallium oxide ($Ga_xO_y$). In an alternative embodiment, the second protective layer 260 may include both an inorganic material and an organic material.

The material of each of the intermediate layer 220, the opposite electrode 230, the first protective layer 240, the contact electrode 250, and the second protective layer 260 may be deposited on the mask layer 320, as well as on the pixel electrode 210.

After the forming of the second protective layer 260, a process of removing the lift-off layer 310 and the mask layer 320 may be further performed. The lift-off layer 310 and the mask layer 320 may be removed by using a first solution. In some embodiments, the mask layer 320 may be removed first and then the lift-off layer 310 may be removed.

According to an embodiment, instead of simultaneously or concurrently manufacturing organic light-emitting diodes OLED emitting red light, green light, and blue light by using an FMM, the organic light-emitting diodes OLED emitting red light, green light, and blue light are sequentially manufactured through a photo-patterning process to provide a high-resolution display apparatus.

In more detail, for example, the organic light-emitting diode OLED emitting red light may be manufactured by the photo-patterning process, and after the manufacturing of the organic light-emitting diode OLED emitting red light, the organic light-emitting diode OLED emitting green light may be manufactured by the photo-patterning process, and after the manufacturing of the organic light-emitting diode OLED emitting green light, the organic light-emitting diode OLED emitting blue light may be manufactured by the photo-patterning process.

Also, during the photo-patterning process, before the forming of the contact electrode 250 for allowing the auxiliary electrode 190 and the opposite electrode 230 to electrically contact each other, the first protective layer 240 is provided on the opposite electrode 230 to protect the organic light-emitting diode OLED against damage that may occur during the forming of the contact electrode 250.

According to an embodiment, in order to prevent or reduce damage to an upper layer of the pixel electrode due to the mask when a deposition process is performed when the mask is in close contact with the substrate in the display apparatus according to the related art, the organic light-emitting diode OLED is manufactured by the photo-patterning process and the protective layer is provided on the opposite electrode during the photo-patterning process to prevent or reduce damage to the organic light-emitting diode OLED. Thus, a display apparatus having improved reliability and a method of manufacturing the display apparatus may be provided.

According to an embodiment, the protective layer is arranged on the opposite electrode during the photo-patterning process, and thus, damage to the organic light-emitting diode OLED may be prevented or reduced. As such, a display apparatus having improved reliability and a method of manufacturing the display apparatus may be implemented. However, the scope of the disclosure is not limited to the above effects.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the inventive concept refers to "one or more embodiments of the inventive concept."

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display apparatus comprising:
a substrate;
a pixel electrode on the substrate;
a pixel defining layer on the pixel electrode, the pixel defining layer having a first opening that exposes a center portion of the pixel electrode;
an auxiliary electrode on the pixel defining layer;
an intermediate layer on the pixel electrode;
an opposite electrode facing the pixel electrode with the intermediate layer therebetween;
a first protective layer on the opposite electrode; and
a contact electrode on the first protective layer, the contact electrode being in electrical contact with the auxiliary electrode and the opposite electrode,
wherein an end of the auxiliary electrode and an end of the opposite electrode are spaced apart from each other with the contact electrode therebetween..

2. The display apparatus of claim 1, wherein
the auxiliary electrode has a second opening that exposes at least partially an upper surface of the pixel defining layer, the second opening being larger than the first opening.
3. The display apparatus of claim 1, wherein
an end of the auxiliary electrode and an end of the intermediate layer are spaced apart from each other on the pixel defining layer.
4. The display apparatus of claim 1, wherein
the first protective layer on the opposite electrode at least partially exposes opposite end portions of the opposite electrode.
5. The display apparatus of claim 4, wherein
the first protective layer comprises an inorganic material having an optical bandgap of 3 eV or greater.
6. The display apparatus of claim 5, wherein
the first protective layer comprises metal oxide having a dielectric constant of 10 or greater.
7. The display apparatus of claim 6, wherein
the first protective layer comprises a light-transmitting organic material.
8. The display apparatus of claim 7, wherein
the first protective layer has a thickness of 1 nm to 100 nm.
9. The display apparatus of claim 1, wherein
the contact electrode comprises a light-transmitting conductive material.
10. The display apparatus of claim 9, wherein
the contact electrode directly and electrically contacts the opposite electrode, at opposite end portions of the opposite electrode that are at least partially exposed by the first protective layer.
11. The display apparatus of claim 10, wherein
the contact electrode directly and electrically contacts the auxiliary electrode.
12. The display apparatus of claim 1, further comprising a second protective layer on the contact electrode.

* * * * *